United States Patent [19]

Beyer et al.

[11] Patent Number: 5,366,923
[45] Date of Patent: Nov. 22, 1994

[54] BONDED WAFER STRUCTURE HAVING A BURIED INSULATION LAYER

[75] Inventors: Klaus D. Beyer, Poughkeepsie; Chang-Ming Hsieh; Louis L. Hsu, both of Fishkill; Tsorng-Dih Yuan, Hopewell Junction, all of N.Y.

[73] Assignee: International Business Machines Corporation, Armonk, N.Y.

[21] Appl. No.: 164,094

[22] Filed: Dec. 8, 1993

Related U.S. Application Data

[62] Division of Ser. No. 883,082, May 15, 1992, Pat. No. 5,276,338.

[51] Int. Cl.$^5$ .............................................. H01L 21/76
[52] U.S. Cl. ................................... 437/62; 437/63; 437/974; 148/DIG. 12; 148/DIG. 135
[58] Field of Search ................. 437/62, 63, 974, 100; 148/DIG. 12, DIG. 135

[56] References Cited

U.S. PATENT DOCUMENTS

| | | | |
|---|---|---|---|
| 3,678,995 | 7/1972 | Collard | 165/185 |
| 3,833,429 | 9/1974 | Monma et al. | 148/1.5 |
| 3,872,496 | 3/1975 | Potter | 357/81 |
| 3,922,775 | 12/1975 | Potter | 25/589 |
| 3,997,381 | 12/1976 | Wanlass | 156/3 |
| 4,707,384 | 11/1987 | Schachner et al. | 427/249 |
| 4,764,804 | 8/1988 | Sahara et al. | 357/81 |
| 4,875,086 | 10/1989 | Malhi et al. | 357/54 |
| 4,878,957 | 11/1989 | Yamaguchi et al. | 148/33.3 |
| 4,938,940 | 7/1990 | Hirose et al. | 432/446 |
| 4,972,250 | 11/1990 | Omori et al. | 357/54 |
| 4,981,818 | 1/1991 | Anthony et al. | 437/233 |
| 4,984,052 | 1/1991 | Koshino et al. | 357/49 |
| 5,107,315 | 4/1992 | Kumagai et al. | 357/23.15 |
| 5,131,963 | 7/1992 | Ravi | 437/974 |
| 5,138,421 | 8/1992 | Saito | 357/49 |
| 5,186,785 | 2/1993 | Annamalai | 437/235 |
| 5,272,104 | 12/1993 | Schrantz et al. | 437/62 |

*Primary Examiner*—Brian Hearn
*Assistant Examiner*—Trung Dang
*Attorney, Agent, or Firm*—Michael J. Balconi-Lamica

[57] ABSTRACT

A wafer structure and a method of making the same, upon which semiconductor devices may be formed, comprises first and second wafers. The first wafer comprises a first substrate having a thin oxide layer formed on a bottom surface thereof, the first substrate having a characteristic thermal expansion coefficient. The second wafer comprises a second substrate having an insulation layer formed on a top surface thereof, the insulation layer having a characteristic thermal expansion coefficient substantially matched with the characteristic thermal expansion coefficient of the first substrate and further having a high thermal conductivity. The second wafer further comprises a thin oxide layer formed on a top surface of the insulation layer, wherein the first thin oxide layer of the first wafer is bonded to the second thin oxide layer of the second wafer.

22 Claims, 4 Drawing Sheets

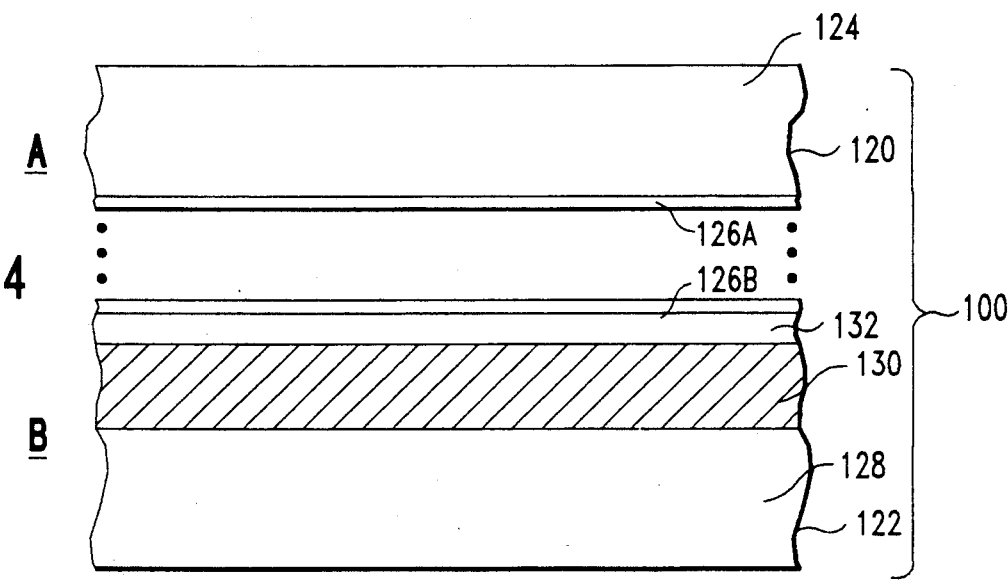
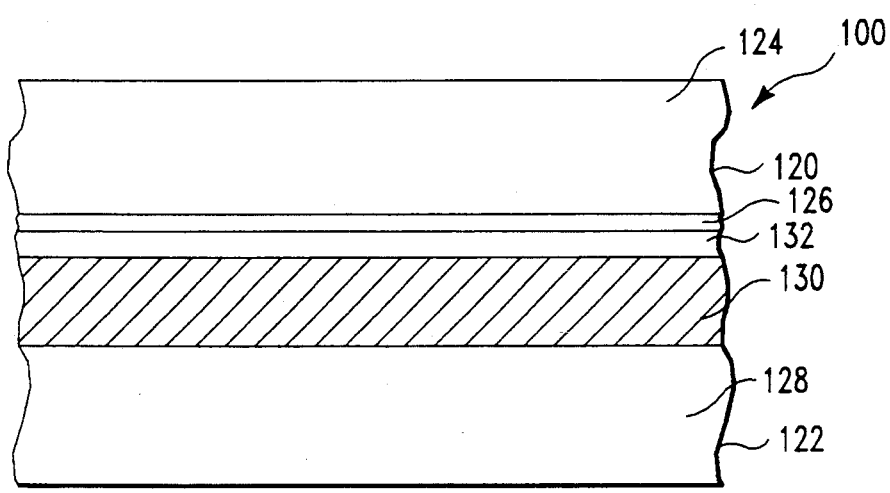
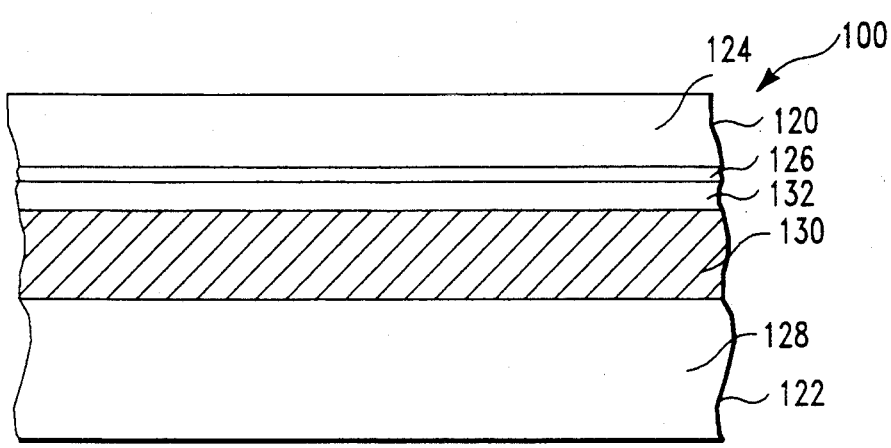

BONDED WAFER STRUCTURE HAVING A BURIED INSULATION LAYER

This is a divisional patent application of copending U.S. patent application Ser. No. 07/883,082, filed on May 15, 1992, now U.S. Pat. No. 5,276,338.

BACKGROUND OF THE INVENTION

1. Field of the Invention

The present invention relates to wafer structures and a method of making the same. More particularly, the invention relates to a wafer structure containing an insulation layer.

2. Description of Related Art

Wafer structures having a "buried insulation" layer are particularly useful for semiconductor devices made via a BiCMOS process. The BiCMOS process is an integrated circuit processing technology which allows bipolar transistors to be formed within substrate wells containing complementary metal-oxide semiconductor (CMOS) transistors. An example of a BiCMOS semiconductor device is one in which "power-hungry" emitter coupled logic (ECL) bipolar circuits are used on a silicon-on-insulator (SOI) structure. The ECL circuits act as logic elements and bipolar drivers. One disadvantage of these ECL circuits is that they produce sufficient heat that the generated heat becomes trapped and gives rise to temperatures unacceptable for normal device operation.

In addition to temperature sensitivity, silicon devices are sensitive to radiation (e.g., α-radiation and cosmic radiation). In order to decrease the radiation sensitivity of the silicon device, the collection volume of the device has to be reduced for hole/electron pairs generated by the radiation impact along the radiation path. The collection volume can be reduced by incorporating a "buried insulation" layer in the silicon device structure.

Recently, the technology for forming "buried insulation" layers has advanced to the stage of manufacturing quantities. In particular, thermally grown $SiO_2$ is used as the buried insulation layer. Bonding two oxide grown wafers can be achieved at an elevated temperature (900° to 1100° C.) whereby the two oxide layers become a single oxide layer. The excess silicon on the device wafer is then removed, first by grinding, then by lapping, and finally by chem.-mech. polishing. On the commercial market, 2 μm thick silicon above a buried 5000 Å thick $SiO_2$ oxide layer is obtainable, for example, from Shin-Etsu Handotai (SHE.) of Tokyo, Japan.

A buried isolation layer of thick thermal $SiO_2$ oxide (5000 Å) can also be used for reducing heat build-up of the ECL circuits on an SOI structure, if a heat conducting path is provided. The use of thermally grown $SiO_2$, by itself, has disadvantages. For instance, the thermal resistance of the oxide is a function of thickness. The thermal resistance of the oxide layer can be minimized by making the layer thin, however, this would result in undesired increased capacitance effects. In addition, the thermal expansion coefficient of $SiO_2$ ($5 \times 10^{-7}$ $C^{-1}$) is not well matched with the thermal expansion coefficient of silicon ($32 \times 10^{-7}$ $C^{-1}$).

An alternative method for keeping a device cool is to incorporate a polycrystalline diamond layer within the semiconductor device structure as shown in U.S. Pat. No. 4,981,818 entitled "Polycrystalline CVD Diamond Substrate For Single Crystal Epitaxial Growth Of Semiconductors" and granted Jan. 1, 1991 to Anthony et al.. In the '818 patent, a chemical vapor deposited (CVD) diamond layer is formed on a single crystal of silicon. During the deposition of the diamond layer, an intermediate layer of single crystal SiC forms between the single crystal of silicon and the polycrystalline CVD diamond layer. The silicon is then completely removed, via etching, to reveal the SiC layer supported on the polycrystalline CVD diamond layer. A semiconductor layer is thereafter epitaxially grown on the exposed single crystal of SiC. A single crystal semiconductor polycrystalline CVD diamond mounted device structure is thus produced.

A device produced via the teaching of the '818 patent, however, has disadvantages. For instance, the crystal quality of the semiconductor grown epitaxially on the SiC is subject to defects, such as, lattice mismatch. In addition, the CVD diamond layer becomes the support substrate for the semiconductor device, thus, necessitating a relatively thick CVD diamond layer. Furthermore, since the diamond substrate of the '818 patent is exposed, any subsequent device fabrication steps of high temperature, high energy processes in oxygen (such as oxidation, plasma ashing, etc.) will attack the substrate. Therefore, it is very difficult to perform process steps with the '818 diamond substrate for processes, such as, isolation trench formation, field isolation, and resist stripping.

It would thus be desirable to provide a wafer structure having a buried insulation layer which is free of the above identified problems. Such a structure should also provide a substrate which is substantially free of lattice mismatch defects and further provide optimal thermal dissipation. Still further, such a structure should be suitable for isolation trench formation.

SUMMARY OF THE INVENTION

According to the invention, a wafer structure having a buried insulation layer, upon which semiconductor structures may subsequently be formed, comprises first and second wafers. The first wafer comprises a first substrate having a thin oxide later formed on a bottom surface thereof, the first substrate having a characteristic thermal expansion coefficient. The second wafer comprises a second substrate having an insulation layer formed on a top surface thereof, the insulation layer having a characteristic thermal expansion coefficient substantially matched with the characteristic thermal expansion coefficient of the first substrate and further having a high thermal conductivity. The second wafer further comprises a thin oxide layer formed on a top surface of the insulation layer. The first thin oxide layer of the first wafer is bonded to the second thin oxide layer of the second wafer.

Also, according to the present invention, a method of making a wafer structure having a buried insulation layer upon which semiconductor structures may subsequently be formed, comprises the steps of:

a) forming a first thin oxide layer on a bottom surface of a first substrate, the first substrate having a characteristic thermal expansion coefficient;

b) forming an insulation layer on a top surface of a second substrate, the insulation layer having a characteristic thermal expansion coefficient substantially matched with the characteristic thermal expansion coefficient of the first substrate and further having a high thermal conductivity;

c) forming a second thin oxide layer on a top surface of the insulation layer; and d) bonding the first thin oxide layer to the second thin oxide layer.

BRIEF DESCRIPTION OF THE DRAWINGS

The foregoing and other structures and teachings of the present invention will become more apparent upon a detailed description of the best mode for carrying out the invention as rendered below. In the description to follow, reference will be made to the accompanying drawings, in which:

FIG. 4a and 4b are cross-sectional views of a first wafer and a second wafer, respectively, at a processing step in accordance with an alternate embodiment of the present invention;

FIG. 5 is a cross-sectional view of the wafer structure according to the invention at a processing step subsequent to that shown by FIG. 4a. and 4b.;

FIG. 6 is a cross-sectional view of the wafer structure according to an alternate embodiment of the present invention;

DETAILED DESCRIPTION OF THE PREFERRED EMBODIMENTS

Figure 1:
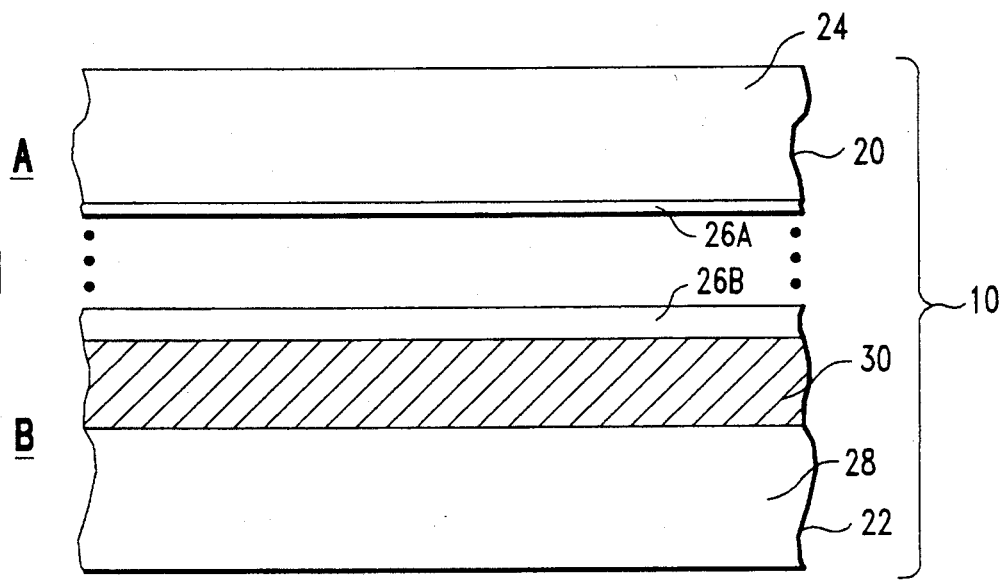
FIG. 1a and 1b are cross-sectional views of a first wafer and a second wafer, respectively, at a processing step in accordance with a preferred embodiment of the present invention.

Referring now to FIG. 1a. and 1b., a bonded wafer structure 10 according to the present invention comprises a first primary wafer 20 and a secondary handle wafer 22. Primary wafer 20 comprises a substrate 24 having an oxide layer 26a. formed on a bottom surface thereof. Substrate 24 preferably comprises an original silicon substrate having a thickness on the order of 100–650 $\mu$m. The original silicon substrate has a thermal expansion coefficient equal to approximately $32 \times 10^{-7}$ $C^{-1}$. Additionally, the original silicon substrate has very low defect density. While substrate 24 has been described with reference to silicon, it should be known that, alternatively, substrate 24 can comprise an original germanium substrate.

Oxide layer 26a. comprises a thin oxide layer having a thickness in the range of approximately 10–500 Å. Oxide layer 26a. can be formed via conventional oxidation techniques whereby both top and bottom surfaces of substrate 24 can be oxidized or just one surface (only the bottom surface is discussed herein for simplicity). Preferably, oxide layer 26a. comprises a silicon oxide layer of 250 Å in thickness, for instance, silicon dioxide ($SiO_2$), and is thermally grown in an oxygen ambient at approximately 800° C. Alternatively, oxide layer 26a. may comprise a pryolytically deposited, CVD oxide, or evaporate oxide, thus upon substrate 24, eliminating silicon consumption.

Secondary handle wafer 22 comprises a substrate 28 having an insulation layer 30 formed on a top surface thereof. Substrate 28 preferably comprises an original silicon substrate having a thickness on the order of 100–650 $\mu$m. Substrate 28 may likewise comprise an original germanium substrate. On a top surface of substrate 28 is formed an insulation layer 30. Insulation layer 30 can comprise a diamond insulation layer having a thickness in the range of 0.01 to 1.0 $\mu$m. Preferably, insulation layer 30 is a chemical vapor deposited (CVD) diamond layer having a thickness of 0.5 $\mu$m. CVD methods are well known in the art and therefore not discussed herein. CVD formation of diamond onto a substrate provides a slow deposition rate for providing a relatively uniform surface. The surface of the diamond layer does however contain bumps due to the crystal growth of the diamond. Diamond use is advantageous since diamond has a thermal coefficient of expansion equal to $18 \times 10^{-7}$ $C^{-1}$ which substantially matches and is similar to that of silicon ($32 \times 10^{-7}$ $C^{-1}$). This is in comparison to that of silicon dioxide, which has a thermal coefficient of expansion equal to $5 \times 10^{-7}$ $C^{-1}$. In addition, CVD diamond has a three orders of magnitude higher thermal conductivity (18–20 W/cm K) than thermally grown $SiO_2$, which has a low thermal conductivity (0.014 W/cm K). Furthermore, CVD diamond film has a dielectric constant between 3 and 6 (depending on the process) and a low dielectric resistivity between $1 \times 10^{10}$ and $1 \times 10^{16}$ ohm cm (depending on the process). It should be noted that insulation layer 30 could likewise comprise a diamond layer formed via plasma spray coating of diamond onto the top surface of substrate 28.

Referring still to FIG. 1b., an oxide layer 26b. is formed on the top surface of insulation layer 30. Oxide layer 26b. performs a dual function. First, oxide layer 26b. provides a buffer layer for overcoming the roughness of the top surface of insulation layer 30. Secondly, oxide layer 26b. is used for bonding with oxide layer 26a. so as to bond primary wafer 20 to secondary handle wafer 22. In the preferred embodiment, insulation layer 30 comprises a diamond layer, whereby oxide layer 26b. must be deposited onto the diamond layer instead of being thermally grown. Thermal oxidation of diamond film produces volatile material, resulting in the decomposition of the diamond film. Oxide layer 26b. is also preferably comprised of a similar material as oxide layer 26a., i.e., a silicon oxide. Still further, oxide layer 26b. is preferably pryolytically deposited $SiO_2$ having an initial thickness greater than 0.1 $\mu$m for overcoming the roughness of the diamond layer top surface. Oxide layer 26b. is then subsequently planarized, for example, through any suitable known process of chem.-mech. polishing, to a thickness less than 0.1 $\mu$m. As a result, oxide layer 26b. is relatively thin (i.e., <0.1 $\mu$m or less than 20% in thickness) with respect to an insulation layer of $SiO_2$ having thickness of 0.5 $\mu$m as used in the prior art.

Figure 2:
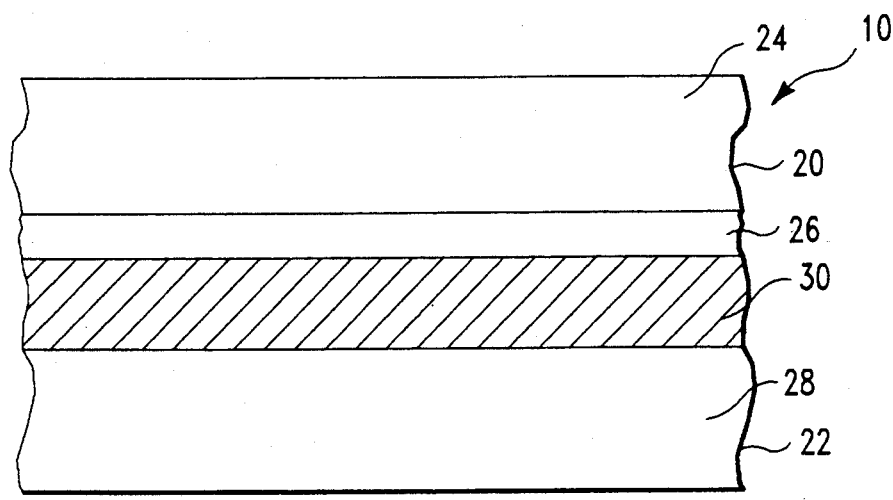
FIG. 2 is a cross-sectional view of the wafer structure according to the invention at a processing step subsequent to that shown by FIG. 1a. and 1b.

Primary wafer 20 is then placed in contact with secondary handle wafer 22 such that oxide layers 26a. and 26b. are in intimate contact. Wafers 20 and 22 are then subjected to a heat treatment between 900° and 1100° C. for a period of time, for example two hours. As a result, the oxide layers 26a. and 26b. bond together, forming a single oxide layer 26 as shown in FIG. 2. The resultant single oxide layer 26 is still relatively thin, having a typical thickness in the range of 250–1000 Å. In the preferred embodiment, oxide layer 26 comprises silicon dioxide and is approximately 500 Å in thickness.

Figure 3:
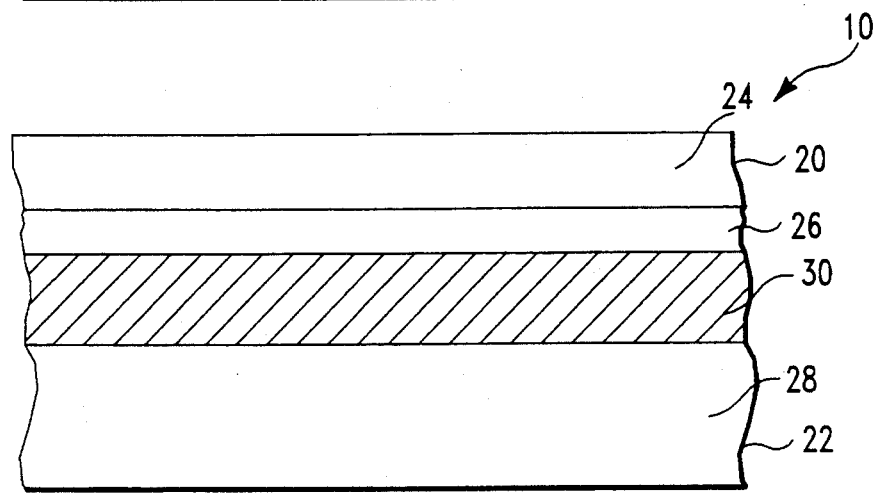
FIG. 3 is a cross-sectional view of the wafer structure according to a preferred embodiment of the present invention.

The wafer structure 10 as shown in FIG. 2 can be further processed by a conventional sequence of grinding, lapping, wet etching, and chem.-mech. polishing to obtain wafer structure 10 as shown in FIG. 3. Grinding, lapping, wet etching, and chem.-mech. polishing are all well known in the art and further discussion thereof is not provided herein. Substrate 24 may be thinned to a desired thickness according to the requirements of a particular device. For instance, substrate 24 can be thinned to a thickness on the order of 2 $\mu$m.

The resultant wafer structure 10 of FIG. 3 is thus suitable for the formation of semiconductor devices in the substrate 24. As described earlier, substrate 24 is preferably an original silicon substrate and is substantially free of lattice mismatch defects and other defects. Wafer structure 10 therefore provides a wafer structure having a buried insulation layer in combination with a substrate in which lattice mismatch defects are minimized. Additionally, the thermal expansion coefficient of the buried insulation layer is substantially matched to the thermal expansion coefficient of the substrate which provides highly efficient transfer of heat away from active semiconductor device areas. The insulation layer also has a high thermal conductivity. Still further, the presence of an insulation layer 30 comprising diamond film, in addition to the thin oxide layer 26, minimizes undesirable capacitive effects.

In an alternate embodiment according to the present invention (as shown in FIGS. 4, 5, and 6), a wafer structure 100 is substantially similar to the preferred embodiment, with the following exceptions. A buffer layer 132, different from oxide layer 126b., is formed on a top surface of insulation layer 130 prior to the formation of oxide layer 126b. (see FIG. 4b.). As previously noted, the surface of diamond film is rough and bumpy due the crystal structure of diamond. Buffer layer 132 is provided to overcome the roughness of the top surface of insulation layer 130 comprising diamond film. In particular, buffer layer 132 provides a relatively soft layer which can be planarized and which also facilitates oxide growth for subsequent bonding. Preferably, buffer layer 132 is a polycrystalline layer, and more particularly, polysilicon. For polysilicon formation, buffer layer 132 may be formed via a low pressure CVD at a temperature of 650° C. Plasma enhanced or photo enhanced CVD may also be employed for the formation of a polysilicon buffer layer 132. As noted previously, such CVD methods are well known in the art and therefore not discussed herein. Buffer layer 132 can likewise comprise an amorphous silicon. For amorphous silicon formation, buffer layer 132 may be formed via a low pressure CVD at a low temperature of 550° C., or other suitable method known in the art. Still further, buffer layer can alternatively comprise a poly-germanium layer.

As indicated above, buffer layer 132 provides a relatively soft layer. Buffer layer 132 essentially replicates the diamond surface and has an initial thickness greater than 0.1 $\mu$m to overcome the roughness of the diamond insulation layer surface. Buffer layer 132 is then planarized through chem.-mech. polishing to a desired thickness. In the alternate embodiment, the planarized thickness of buffer layer 132 is in the range of 0.250 $\mu$m to 0.1 $\mu$m.

Subsequent to the formation of buffer layer 132, a thin oxide layer 126b. is formed on a top surface thereof. Oxide layer 126b. has a thickness in the range of approximately 10–500 Å. Preferably, oxide layer 126b. comprises a silicon oxide layer, such as SiO$_2$, of 250 Å in thickness and is thermally grown in an oxygen ambient at approximately 800° C. Alternatively, oxide layer 126b. may be pryolytically deposited upon buffer layer 132.

The alternate embodiment bonded wafer structure 100 thus comprises a first "primary wafer 120 and a secondary handle wafer 122. Primary wafer 120 comprises a substrate 124 having a thin oxide layer 126a. formed on a bottom surface thereof. Secondary handle wafer 122 comprises a substrate 128 having an insulation layer 130 formed on a top surface thereof, wherein, insulation layer 130 preferably is a chemical vapor deposited (CVD) diamond layer having a thickness of 0.5 $\mu$m. Buffer layer 132 is formed on the top surface of insulation layer 130 and, subsequently, thin oxide layer 126b. is formed on the top surface of buffer layer 132. Primary wafer 120 is bonded to secondary handle wafer 122 via a heat treatment, as discussed previously, such that oxide layers 126a. and 126b. bond forming a single oxide layer 126. Oxide layer 126 is relatively thin, having a thickness in the range of 250–1000 Å in comparison to an oxide layer having a thickness of 5000 Å. Preferably, oxide layer 126 comprises silicon dioxide and is approximately 500 Å in thickness.

The wafer structure 100 as shown in FIG. 5 can be further processed by a conventional sequence of grinding, lapping, wet etching, and chem.-mech. polishing to obtain wafer structure 100 as shown in FIG. 6. As noted earlier, grinding, lapping, wet etching and chem.-mech. polishing are all well known in the art and further discussion thereof is not provided herein. Substrate 124 may be thinned to a desired thickness according to the requirements of a particular device. For instance, substrate 124 can be thinned to a thickness on the order of 2 $\mu$m.

The resultant wafer structure 100 of FIG. 6 is thus suitable for the formation of semiconductor devices in the substrate 124. Substrate 124 preferably comprises an original silicon substrate which is substantially free of lattice mismatch defects and other defects. Thus, wafer structure 100 provides a wafer structure having a buried insulation layer in combination with a substrate in which lattice mismatch defects are minimized. Additionally, the thermal expansion coefficient of the buried insulation layer is substantially matched to the thermal expansion coefficient of the substrate which provides highly efficient transfer of heat away from active semiconductor device areas. Still further, the presence of the insulation layer 130 comprising diamond film, in addition to the buffer layer 132 and thin oxide layer 126, minimizes undesirable capacitive effects.

Figure 7:
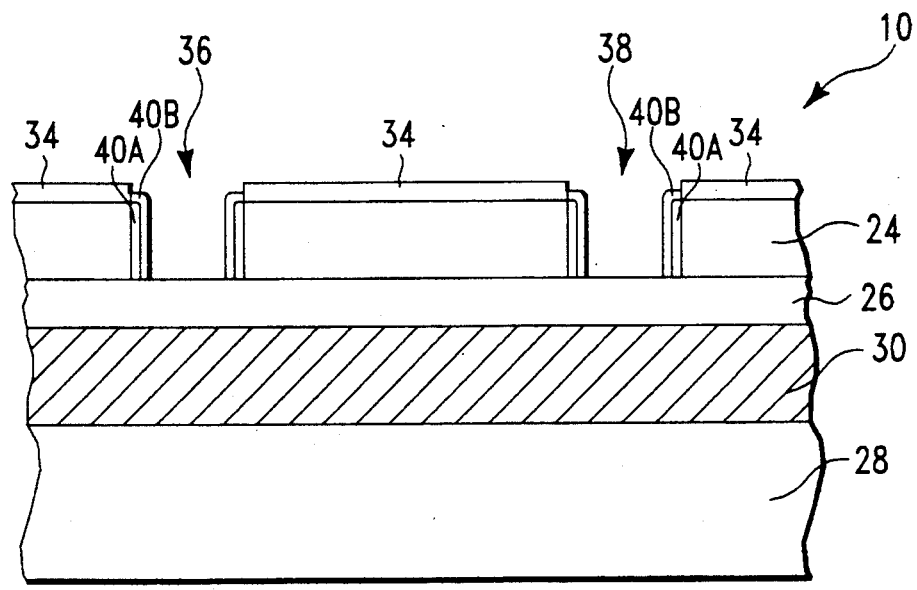
FIG. 7 is a cross-sectional view of the wafer structure of the present invention at a processing step for isolation trench formation.
Figure 8:
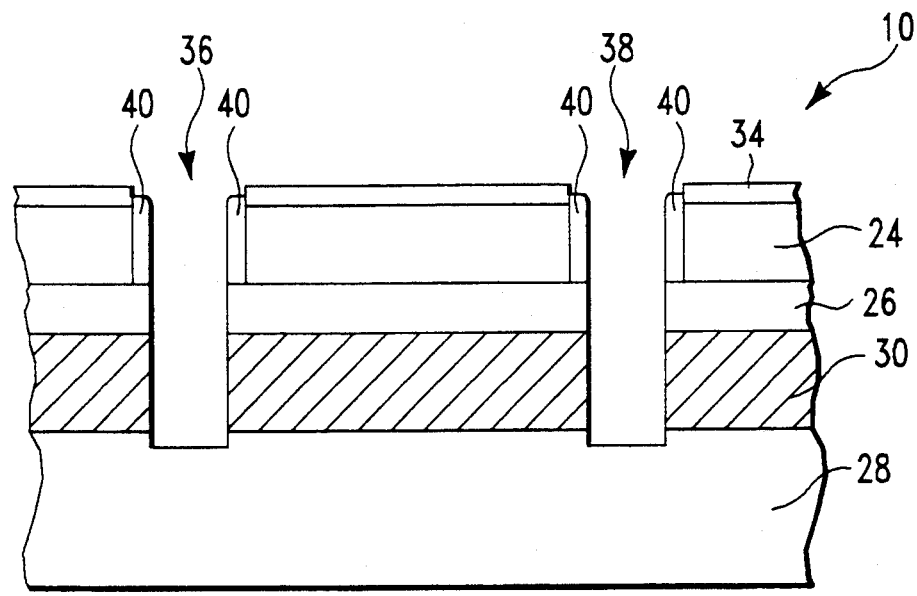
FIG. 8 is a cross-sectional view of the wafer structure of the present invention at a processing step subsequent to that shown by FIG. 7.

In yet another alternate embodiment according to the invention, wafer structure 10 is well suited for the formation of isolation trenches (FIGS. 7 and 8). In particular, wafer structure 10 provides a reactive ion etch (RIE) stop layer comprising oxide layer 26. Oxide layer 26 further provides protection to the underlying insulation layer 30. Forming of an isolation trench having thermally oxidized trench sidewalls would cause problems if formed directly in a diamond insulation layer. The procedure according to the yet another alternate embodiment of the present invention circumvents the oxidation of the diamond film insulation layer, which occurs above 700° C. RIE is well known in the art and therefore only briefly discussed herein.

Referring now to FIG. 7, there is shown wafer structure 10 which is formed by using the method described with respect to FIGS. 1-3 and in which a first step RIE etch of the isolation trench formation has been completed. The top surface of substrate 24, after being thinned to a desired thickness as previously discussed, is oxidized and then deposited with a layer of nitride, using standard techniques, to form composite film 34. This composite film 34 is used as a trench masking layer. Trench patterning is then carried out using a conventional lithographic process to define trench locations 36 and 38 via a patterned photoresist film (not shown). The film layer 34 is then opened by carbontetrafluoride (CF4) plasma etching. After etching, the photoresist film is stripped. A HBr/Cl$_2$ plasma is then used to etch the substrate 24 and stop at the buried oxide layer 26. Sidewalls 40 comprising 40a. and 40b. are then formed. Formation of trench sidewalls 40a. can be accomplished via thermal oxidation. A combination of thermal oxidation and CVD SiO$_2$ deposition and etch can be used to form sidewall spacer 40b. Thus, first step preliminary trenches 36 and 38, as shown in FIG. 7, are formed.

A second step trench RIE etch of the isolation trench formation is then performed for cutting through oxide layer 26, the insulation layer 30, and 5000-10000 Å below the insulation layer 30 as shown in FIG. 8. That is, the second step etch comprises etching oxide layer 26 using top nitride mask layer 34 as a mask. A selective etch of oxide to nitride must be used. This etch is well known in the art and is not described herein. Then, insulation layer 30 is opened using an O$_2$/Ar plasma. This process has infinitive etch selectivity to oxide, nitride and silicon and is also well known in the art. Finally, a HBr/Cl$_2$ plasma is used again to overetch into the silicon substrate 28 of handle wafer 22 about 10% of the total trench depth.

Figure 9:
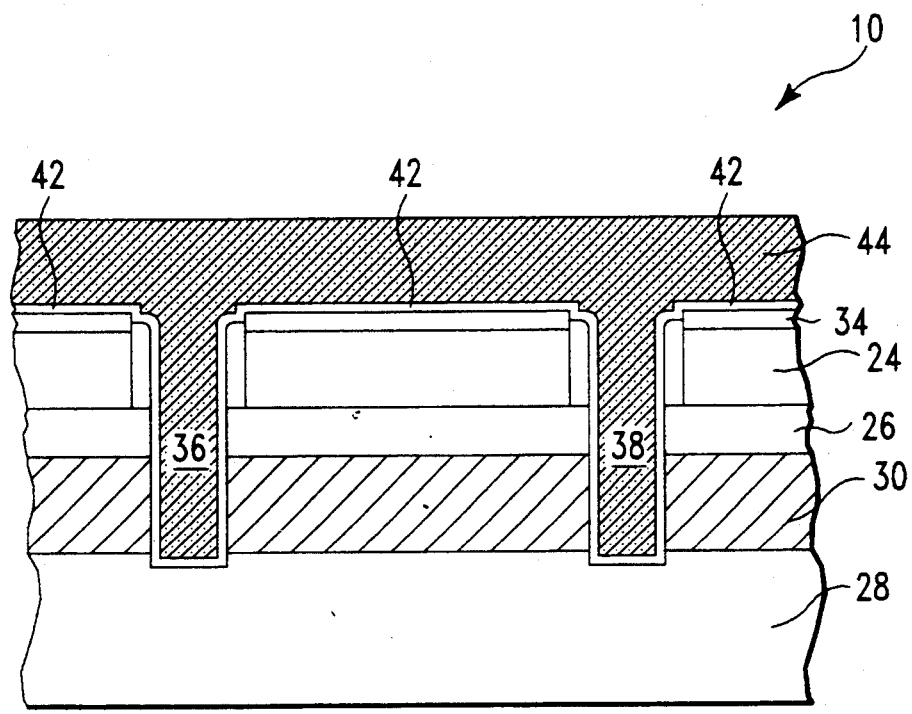
FIG. 9 is a cross-sectional view of the wafer structure of the present invention at a processing step subsequent to that shown by FIG. 8.
Figure 10:
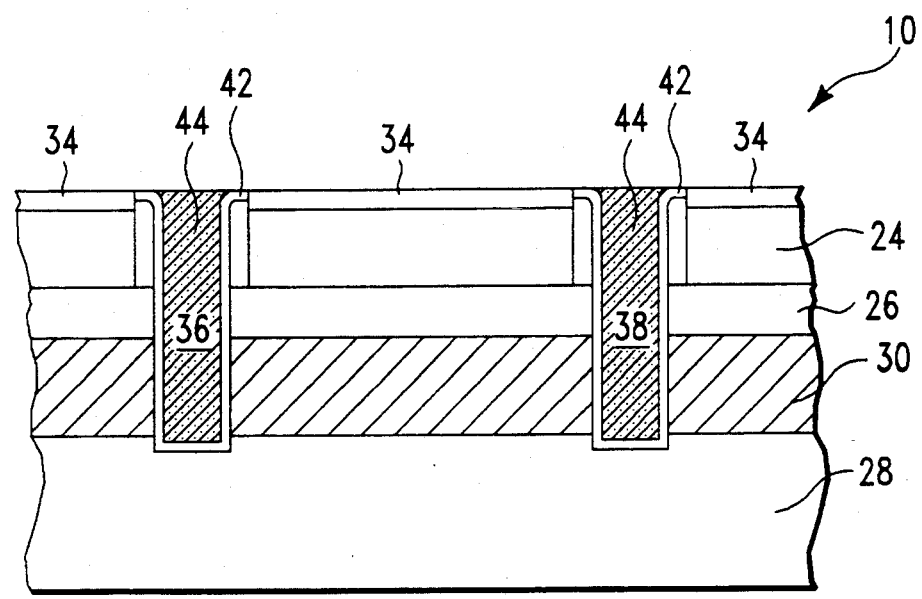
FIG. 10 is a cross-sectional view of the wafer structure of the present invention at a processing step subsequent to that shown by FIG. 9.

Upon completion of the second step RIE etch, trenches 36 and 38 is preferably coated with a thin CVD SiO$_2$ coating 42 and subsequently filled using borophosphosilicate doped glass (BPSG), borosilicate doped glass (BSG), or polysilicon, as a trench fill 44. Only non-oxidative ambients are used during the fill process, since an oxidative ambient would attack the diamond insulation layer. CVD deposition of the trench fill 44 is then performed such that the fill is closed at the top of each trench when completed. Any voids or crevices created during trench filling can be eliminated by subsequently reflowing the trench fill glass between 900° to 1000° C. for approximately 30 minutes in nitrogen. This results in filled trenches 36 and 38 as shown in FIG. 9. The structure 10 may then be planarized to a desired thickness in preparation for subsequent device fabrication (FIG. 10).

Other methods of completing the isolation trenches 36 and 38, subsequent to the secondary trench etch, may be employed. For instance, the method for forming a void free isolation pattern, as described in U.S. Pat. Nos. 4,526,631 and 4,689,656, incorporated herein by reference, may be used.

The advantage of the above described two step RIE process in conjunction with the wafer structure 10 of the present invention is the formation of a "good" oxide near both device junctions at the surfaces of layer 24, i.e., at the interface of silicon 24 and oxide 26. The two step RIE process further provides for a non-oxidizing process for forming a CVD oxide on the buried insulation layer 30, i.e., the buried CVD diamond film.

The above two step RIE process, as described with respect to wafer structure 10, is similarly applicable to wafer structure 100, with the following differences. Wafer structure 100, as formed by the method described with respect to FIGS. 4-6, is processed via a second step RIE etch which also cuts through buffer layer 132. In particular, the second step etch for structure 100 comprises etching oxide layer 126 using a top nitride mask layer, similar to that described with respect to structure 10, as a mask. A selective etch of oxide to nitride must be used. Polysilicon buffer layer 132 is then etched in a HBr/Cl$_2$ plasma. Then, diamond insulation layer 130 is opened using an O$_2$/Ar plasma. Finally, a HBr/Cl$_2$ plasma is used to overetch into silicon substrate 128 of handle wafer 122 about 10% of the total trench depth. Since the polysilicon buffer layer 132 is a semiconductive film, the trench must etch to cut through this layer in order to form a well-isolated structure.

Thus it has been shown that in order to reduce the heat build-up of ECL circuits on SOI structures, the thick thermal SiO$_2$ oxide layer (5000 Å) positioned between the two silicon wafers of prior art wafer structures is replaced by a (5000 Å) CVD diamond layer. Such a CVD diamond layer has a three orders of magnitude higher thermal conductivity (18-20 W/cm K) than thermally grown SiO$_2$. The CVD diamond film further has a dielectric constant between 3 and 6 (depending on process) and a low dielectric resistivity between $1 \times 10^{10}$ and $1 \times 10^{16}$ ohm cm (depending on process). Still further, the diamond film has a better match of the thermal expansion coefficient ($18 \times 10^{-7}$ C$^{-1}$) with silicon ($32 \times 10^{-7}$ C$^{-1}$) than SiO$_2$ ($5 \times 10^{-7}$ C$^{-1}$). Lastly, the wafer structure of the present invention provides a well suited structure for isolation trench formation.

While the invention has been particularly shown and described with reference to the preferred and alternate embodiments thereof, it will be understood by those skilled in the art that various changes in form and detail may be made therein without departing from the spirit and scope of the invention.

What is claimed is:

1. A method of producing a wafer structure upon which semiconductor devices may subsequently be formed, said method comprising the steps of:

a) forming a first thin silicon oxide layer of a thickness less than 0.05 μm on a bottom surface of a first original substrate of a thickness on the order of 100-650 μm and being substantially free of lattice mismatch defects, the first substrate having a characteristic thermal expansion coefficient;

b) depositing a chemical vapor deposited (CVD) diamond insulation layer of a thickness less than 1.0 μm on a top surface of a second original substrate, the insulation layer having a characteristic thermal expansion coefficient substantially matched with the characteristic thermal expansion coefficient of the first substrate, the insulation layer further having a high thermal conductivity;

c) forming a second thin silicon oxide layer of a thickness less than 0.05 μm on a top surface of the insulation layer and planarizing the second thin oxide layer to a prescribed thickness; and d) bonding the first thin oxide layer to the second thin oxide layer to form a single combined thin silicon oxide layer having a thickness in the range of 0.025 to 0.1 μm.

2. The method of producing a wafer structure according to claim 1, further comprising the step of
 e) thinning the first substrate of said first wafer down to a desired thickness.

3. The method of producing a wafer structure according to claim 1, wherein said step of forming a first thin oxide layer on a first substrate comprises forming the first thin oxide layer on a silicon substrate.

4. The method of producing a wafer structure according to claim 1, further wherein:
 said step of depositing the CVD diamond insulation layer comprises depositing the insulation layer to have a thickness of 0.5 μm;
 said step of forming the single combined thin silicon oxide layer comprises forming the thin silicon oxide layer to have a thickness 0.05 μm.

5. The method of producing a wafer structure according to claim 4, further comprising the step of
 e) thinning the first substrate of said first wafer down to a desired thickness.

6. The method of producing a wafer structure according to claim 4, still further wherein said step of forming a first thin oxide layer on a first substrate comprises forming the first thin oxide layer on a silicon substrate.

7. A method of producing a wafer structure upon which semiconductor devices may subsequently be formed, said method comprising the steps of:
 a) forming a first thin silicon oxide layer of a thickness less than 0.05 μm on a bottom surface of a first original substrate of a thickness on the order of 100–650 μm and being substantially free of lattice mismatch defects, the first substrate having a characteristic thermal expansion coefficient;
 b) depositing a chemical vapor deposited (CVD) diamond insulation layer of a thickness less than 1.0 μm on a top surface of a second original substrate, the insulation layer having a characteristic thermal expansion coefficient substantially matched with the characteristic thermal expansion coefficient of the first substrate;
 c) forming a buffer layer on a top surface of the insulation layer and planarizing the buffer layer to a desired thickness of less than 0.1 μm;
 d) forming a second thin silicon oxide layer a thickness less than 0.05 μm on a top surface of the buffer layer; and
 e) bonding the first thin oxide layer to the second thin oxide layer to form a single combined thin silicon oxide layer having a thickness in the range of 0.025 to 0.1 μm.

8. The method of producing a wafer structure according to claim 7, further comprising the step of
 e) thinning the first substrate of said first wafer down to a desired thickness.

9. The method of producing a wafer structure according to claim 7, wherein said step of forming a first thin oxide layer on a first substrate comprises forming the first thin oxide layer on a silicon substrate.

10. The method of producing a wafer structure according to claim 7, wherein said step of forming a buffer layer comprises depositing a polycrystalline layer.

11. The method of producing a wafer structure according to claim 10, wherein depositing the polycrystalline layer comprises depositing polysilicon.

12. The method of producing a wafer structure according to claim 7, wherein said step of forming a buffer layer comprises depositing amorphous silicon.

13. The method of producing a wafer structure according to claim 7, further wherein:
 said step of depositing the CVD diamond insulation layer comprises depositing the insulation layer to have a thickness of 0.5 μm; and
 said step of forming the single combined thin silicon oxide layer comprises forming the thin silicon oxide layer to have a thickness of 0.05 μm.

14. The method of producing a wafer structure according to claim 13, further comprising the step of
 e) thinning the first substrate of said first wafer down to a prescribed thickness.

15. The method of producing a wafer structure according to claim 13, still further wherein said step of forming a first thin oxide layer on a first substrate comprises forming the first thin oxide layer on a silicon substrate.

16. The method of producing a wafer structure according to claim 13, still further wherein said step of forming a buffer layer comprises depositing a polycrystalline layer.

17. The method of producing a wafer structure according to claim 16, still further wherein depositing the polycrystalline layer comprises depositing polysilicon.

18. The method of producing a wafer structure according to claim 13, still further wherein said step of forming a buffer layer comprises depositing amorphous silicon.

19. The methods of producing a wafer structure according to claim 2 further comprising the steps of:
 f) forming a dielectric layer comprising an oxide/nitride film on a top surface of the first substrate, the dielectric layer acting as a trench masking layer;
 g) masking isolation trench locations on a top surface of the dielectric layer;
 h) forming preliminary trenches via etching the first substrate at isolation trench locations down to the bonded oxide layer;
 i) forming trench sidewalls on the inner surfaces of the preliminary trenches;
 j) forming secondary trenches via etching through the bonded oxide layer, the insulation layer, and slightly into the substrate layer and leaving the preliminary trench sidewalls intact;
 k) coating the inner surfaces of the secondary etched trenches with a thin CVD $SiO_2$; and
 l) filling the secondary trenches with a trench fill.

20. The method of producing a wafer structure according to claim 19, further comprising the step of:
 m) planarizing the top surface of the wafer structure to a desired thickness.

21. The method of producing a wafer structure according to claim 7, further comprising the steps of:
 f) forming a dielectric layer comprising an oxide/nitride film on a top surface of the first substrate, the dielectric layer acting as a trench masking layer;
 g) masking isolation trench locations on a top surface of the dielectric layer;
 h) forming preliminary trenches via etching the first substrate at isolation trench locations down to the bonded oxide layer;

i) forming trench sidewalls on the inner surfaces of the preliminary trenches;

j) forming secondary trenches via etching through the bonded oxide layer, the buffer layer, the insulation layer, and slightly into the substrate layer and leaving the preliminary trench sidewalls intact;

k) coating the inner surfaces of the secondary etched trenches with a thin CVD $SiO_2$; and l) filling the secondary trenches with a trench fill.

22. The method of producing a wafer structure according to claim 21, further comprising the step of:

m) planarizing the top surface of the wafer structure to a desired thickness.

* * * * *